March 1, 1966 D. J. MADDEN 3,237,761
PACKAGE OF ELECTRICAL COMPONENTS
Filed Dec. 6, 1963
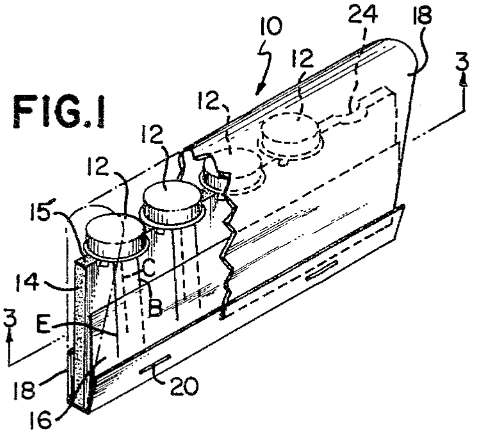
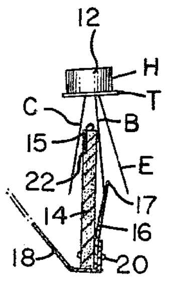
FIG. 2
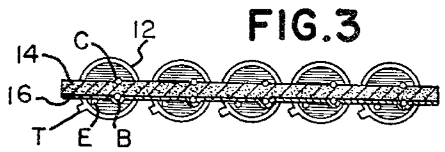
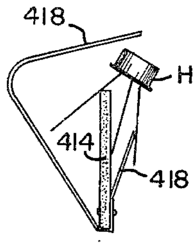
FIG. 4
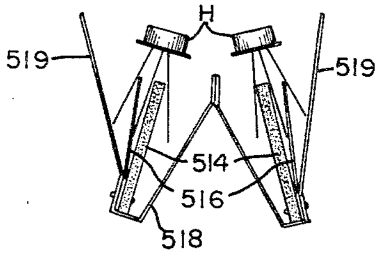
FIG. 5
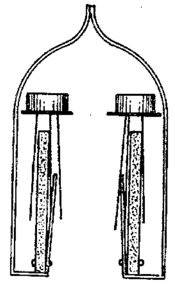
FIG. 6
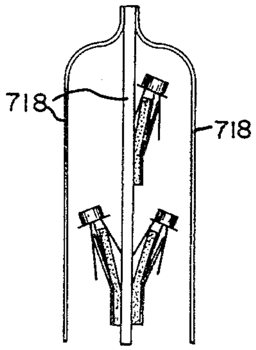
FIG. 7

United States Patent Office 3,237,761
Patented Mar. 1, 1966

3,237,761
PACKAGE OF ELECTRICAL COMPONENTS
Donald J. Madden, 24 Spring Road, Weston, Mass.
Filed Dec. 6, 1963, Ser. No. 328,752
7 Claims. (Cl. 206—65)

The present invention relates to packages for electrical components, and more particularly, to packages for transistors.

Transistors are small electrical devices comprising an hermetically sealed header about the size of a fingernail and two or three lead wires about an inch to two inches long extending from the header. In use, the leads are trimmed and connected to appropriate electrical circuits wherein the transistors are utilized as electrical valves, amplifiers, rectifiers and for other purposes. In the prior art, transistors are packaged in separate compartments of a package for protection against damage due to impacts during transport. The transistors are individually removed from the package for insertion into an electrical testing machine and/or X-ray machine and then individually repackaged.

It is a principal object of the invention to provide a new package for transistors and similar electrical devices which allows the transistors to be electrically tested and X-rayed without removal from the package.

It is another object of the invention to provide a package for electrical devices of a similar nature which aligns a plurality of such devices in similar fashion and can be constructed to accommodate different sizes of such devices.

It is another object of the invention to provide a package which is sufficiently rugged to be re-used and sufficiently inexpensive to be distributed as a throw-away.

In accordance with the present invention, transistors or similar electrical devices are placed in a package designed to take advantage of the standard spacing of wire leads to align the devices in a predetermined manner. Pads within the package accomplish this locating function. The package also comprises a cover around the transistors and locating pads. In a preferred embodiment, the cover has a configuration similar to that of paper matchbook covers.

Transistors in the package are oriented for X-raying and can be electrically tested and X-rayed without removal from the package. The arrangement of all transistors in the package in the same orientation allows the use of automatic testing machines. The package materials are preferably light and inexpensive plastics such as polystyrene plastics which provide protection from moisture and requisite dielectric voltage or insulation.

Other objects and advantages of the invention will in part be obvious and will in part appear hereinafter.

The invention comprises, as a new article of manufacture, a package for transistors and similar electrical devices comprising the choice and arrangement of parts, exemplified in the following detailed disclosure and accompanying drawings, and the scope of application of which will be indicated in the claims.

Preferred embodiments of the invention are now described with reference to the accompanying drawings wherein:

FIG. 1 is a schematic, partially isometric, partially cutaway, view of a package made in accord with my best known method of practicing the invention, the package being shown in closed position;

FIG. 2 is a cross-section view of the locating pads in the package of FIG. 1;

FIG. 3 is a schematic view showing the arrangement of transistors as viewed in the direction indicated by the arrows III—III in FIG. 1;

FIGS. 4–7 are schematic, side views showing modified embodiments of the invention.

Referring now to FIG. 1, the package 10 is shown in closed position holding several transistors 12. The package comprises a first pad 14, a second pad 16 and a cover 18. The cover 18 is partially cutaway to show one of the transistors. The pads 14 and 16 are secured to each other and to the cover 18 by a staple 20 at the ends of the pads remote from the transistors. The transistors are seated on the near end 15 of pad 14.

Referring now to FIG. 2, there is show a transistor 12 which comprises a header H with a tab T extending therefrom. Three wires extend from the header; a wire C extends from the transistor collector within the header; similarly, a wire B extends from the transistor base and a wire E extends from the transistor emitter. The relative locations of the tab and wires are standard, varying slightly from size to size. The transistor is easily assembled with the package by first straddling the pad 14 with wires C and B and then tilting header H to the right and lowering it so that wires B and E straddle pad 16.

Substantial advantages are gained by having the end 17 of pad 16 lower than the end 15 of pad 14. In lowering the header H, it would be relatively difficult to straddle three wires over two pads of equal height. But the offset height of the pads, as shown, makes the assembly an easy task. The end 17 of pad 16 should be sufficiently rigid to avoid folding upon itself when pushed by a wire and to avoid tearing when pushed by one of the wires.

The header is lowered until it is seated on pad 14. It should be noted that the thickness of pad 14 is slightly greater than the minimum spacing between wires C and B near header H. The natural resilience of the wires and the yield of the pad 14 tend to compress the pad 14 and lock the wires B and C against twisting or lateral movement.

The resultant arrangement is shown in FIG. 3 where the viewer looks towards the bottoms of the transistors 12. The pad 14 is slightly compressed between the collector and base wires, C and B, of the transistors. As a result, all the transistors 12 tend to be locked in the same rotary position, as indicated by the parallel alignment of tabs T. Thus, it is possible to X-ray the package and get a uniform picture of all the transistors without removing or adjusting them individually.

The above described locking action and the seating of the headers on the ends 15 of pads 14 prevent the transistors from sliding or falling toward each other even though the package may be held in any attitude and vibrated.

Returning to FIG. 2, it is shown that a stripe 22 of metallic paint or coating is applied in any known manner on the back of pad 14 to serve as a terminal for connecting the wires C of the transistors to external test circuits (not shown). The cover of the package (FIG. 1) can be lifted and leads or probes can be applied to the wires B and E. Thus, the transistors can be subjected to circuit testing without removal from the package. If faults are detected in any transistor, that transistor can be marked or lifted out and easily replaced.

The materials for the package parts are preferably polystyrene plastics. The pad 14 consists of one or a plurality of laminated strips of expanded polystyrene foam, cut to the desired length and width. The pad 16 is formed from a paper-like polystyrene sheet. These materials inherently provide the necessary rigidity of edges 15 and 17. The cover 18 is made of the same material as pad 16. Other dielectric materials such as other plastics, paper, and cardboard can be substituted for the polystyrenes. For instance, a folded sheet of paper could be used as pad 16, with the fold providing the rigid edge 17, and a paper composite several dozen sheets thick could serve as pad 14.

In another embodiment of the invention, the cover 18 is made of a transparent plastic and descriptive information such as electrical ratings is printed on the fronts of pads 14 and 16. This is of particular advantage where the cover is heat sealed to protect the transistors from moisture during transport and storage since the ratings may be viewed without opening the package.

Where automatic testing machines require precise lateral location of the transistors along edge 15 of pad 14, then edge 15 can be provided with recesses or grooves (shown by the dotted lines at 24 of FIG. 1) to receive the header and locate the transistors. Otherwise, index lines or other indicia can be marked on pad 14 to indicate the desired location for each transistor.

Other embodiments of the invention are shown in FIGS. 4–7. In FIG. 4, it is shown that the cover can be an extension of the secondary pad rather than a separate member. A primary pad 414 is surrounded by a cardboard sheet 418 which serves as both cover and secondary pad. In FIG. 5, a double thick package is provided by using a W-shaped cover 518. When the package is closed, the ends 519 of the cover can be overlapped or sealed. FIG. 6 shows a way of forming a double thick package. The cover also serves as secondary pad, as in FIG. 4. Multiple packages can also be combined as shown in FIG. 7 wherein covers 718 are draped together. Multiple sets of locating pads are secured to the central cover by staples or suitable adhesives, or can be heat-sealed where a plastic material is used and permits such.

Since several variant embodiments, in addition to those described above, can be made within the scope of the present invention, the above descriptions and their accompanying drawings should be considered as illustrative and not in a limiting sense.

What is claimed is:

1. A package of electrical components of the type comprising a header and a plurality of wires extending away from the header, the package comprising a support pad of flexible dielectric material, a row of said headers seated on an end of said support pad with first and second wires from each header straddling the two faces of the pad, a second flexible, dielectric pad partially overlying one of the faces of the support pad and the wires thereon so that the said wires are partially covered, the support pad and the second pad being arranged so that a third wire from each header overlays the second pad whereby the first, second, and third wires of each header are insulated from each other, and a cover for enclosing the components and pads.

2. The package of claim 1 wherein the support pad is about as thick as the spacing between the first and second wires near the header whereby the components tend to be locked in place.

3. A package of electrical components of the type having a body portion and three leads extending from the same end thereof, comprising first and second elongated sheets of a plastic material, means for holding said sheets adjacent each other in face to face relationship, one edge of said first sheet extending beyond the corresponding edge of said second sheet, said first sheet having a thickness of about the spacing between adjacent leads on said components, said components having their body portions firmly seated on said one edge of said first sheet, with said adjacent leads straddling the two faces thereof, one of said adjacent leads extending between said first and second sheets, the third leads of said components overlaying said second sheet whereby the first, second and third leads are insulated from each other.

4. A package of electrical components comprising a header and a plurality of wires extending away from the header, the package comprising a support pad of flexible electrically insulating material, a row of said headers seated on an end of said support pad with first and second wires from each header straddling the two faces of the pad, a second flexible pad of electrically insulating material partially overlying one of the faces of the support pad and the wires thereon so that the said wires are partially covered, the support pad and the second pad being arranged so that a third wire from each said header overlays the second pad whereby the first, second and third wires of each said header or insulated from each other, means for locating said components at predetermined lateral locations along said support pad and transparent cover for enclosing the components.

5. The package of claim 4 wherein said locating means are grooves in said support pad.

6. A package of electrical components of the type having a body portion and three leads extending from the same side thereof, comprising first and second members of electrically insulating material, the edge of said first member extending beyond the corresponding edge of said second member, said first member being thicker than said second member, means for holding said members in face to face relationship, a plurality of said electrical components having their body portions positioned in side by side relationship on the edge of said first member, a first lead of each component overlaying one face of said first member and extending between said first and second member, a second lead of each component overlaying the other face of the first member, the third lead of each component overlaying the second member whereby the first, second and third leads of each component are insulated from each other, means providing a terminal electrical connection for said second leads to an external circuit, and a cover for enclosing the components.

7. The package of claim 6 wherein said electrical connection is a metallic coating on said other face of the first member.

References Cited by the Examiner

UNITED STATES PATENTS

| | | | |
|---|---|---|---|
| 2,466,571 | 4/1949 | Bolling | 206—66 |
| 2,645,339 | 7/1953 | Toy | 206—63.2 |
| 2,766,510 | 10/1956 | Heibel | 206—66 |
| 2,949,182 | 8/1960 | Williams | 206—65 |
| 2,962,161 | 11/1960 | Lacy | 206—79 |
| 3,048,268 | 8/1962 | Rocchi | 206—65 |
| 3,093,243 | 6/1963 | Petter | 206—65 |

LOUIS G. MANCENE, *Primary Examiner.*

GEORGE O. RALSTON, THERON E. CONDON, *Examiners.*